United States Patent
Hanafi et al.

(10) Patent No.: US 10,033,340 B1
(45) Date of Patent: Jul. 24, 2018

(54) LOW-NOISE AMPLIFIER (LNA) WITH CAPACITIVE ATTENUATOR

(71) Applicant: QUALCOMM Incorporated, San Diego, CA (US)

(72) Inventors: Bassel Hanafi, San Diego, CA (US); Sherif Abdelhalem, San Diego, CA (US); Hasnain Lakdawala, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/400,078

(22) Filed: Jan. 6, 2017

(51) Int. Cl.
| | |
|---|---|
| *H03G 3/30* | (2006.01) |
| *H03F 1/22* | (2006.01) |
| *H03G 1/00* | (2006.01) |
| *H03F 3/19* | (2006.01) |
| *H03F 3/21* | (2006.01) |
| *H03F 1/02* | (2006.01) |

(52) U.S. Cl.
CPC ......... *H03G 1/0005* (2013.01); *H03F 1/0205* (2013.01); *H03F 3/19* (2013.01); *H03F 3/21* (2013.01); *H03F 2200/222* (2013.01); *H03F 2200/294* (2013.01); *H03F 2200/451* (2013.01)

(58) Field of Classification Search
CPC .... H03G 3/3026; H03G 3/3031; H03F 3/005; H03F 1/22; H03F 1/223
USPC .................................. 330/144, 145, 284, 311
See application file for complete search history.

(56) References Cited

U.S. PATENT DOCUMENTS

| | | | |
|---|---|---|---|
| 7,482,879 B2 | 1/2009 | Koutani et al. | |
| 7,649,418 B2 | 1/2010 | Matsui | |
| 8,912,850 B2 | 12/2014 | Trulls et al. | |
| 9,002,306 B2 | 4/2015 | Li et al. | |
| 9,196,962 B2 | 11/2015 | Johnson et al. | |

(Continued)

OTHER PUBLICATIONS

Han F., et al., "A Wideband CMOS Variable Gain Low Noise Amplifier Based on Single-to-differential Stage for TV Tuner Applications", Solid-state Circuits Conference, 2008, A-SSCC '08. IEEE Asian, IEEE, Piscataway, NJ, USA LNKDDOI: 10.1109/ASSCC.2008.4708826, Nov. 3, 2008 (Nov. 3, 2008), pp. 457-460, XP031373061 ISBN: 978-1-4244-2604-1.

(Continued)

*Primary Examiner* — Steven J Mottola
(74) *Attorney, Agent, or Firm* — Patterson & Sheridan, L.L.P.

(57) ABSTRACT

Certain aspects of the present disclosure generally relate to a multi-output amplifier implemented using a capacitive attenuator. For example, the multi-output amplifier generally includes a first capacitive attenuator coupled to an input node of the multi-output amplifier. In certain aspects, the multi-output amplifier also includes a first amplification stage having an input coupled to a tap node of the first capacitive attenuator and an output coupled to a first output node of the multi-output amplifier, and a second amplification stage having an output coupled to a second output node of the multi-output amplifier. For certain aspects, the multi-output amplifier includes a second capacitive attenuator coupled to the input node of the multi-output amplifier, and the second amplification stage may have an input coupled to a tap node of the second capacitive attenuator.

29 Claims, 9 Drawing Sheets

(56) References Cited

U.S. PATENT DOCUMENTS

| | | | |
|---|---|---|---|
| 2011/0316631 A1* | 12/2011 | Rafi | H03F 3/19 |
| | | | 330/277 |
| 2012/0121106 A1* | 5/2012 | Henriksen | H03F 1/3211 |
| | | | 381/94.1 |
| 2013/0315348 A1 | 11/2013 | Tasic et al. | |
| 2014/0213209 A1 | 7/2014 | Holenstein et al. | |

OTHER PUBLICATIONS

International Search Report and Written Opinion—PCT/US2017/066246—ISA/EPO—dated Mar. 5, 2018.

Xiao J., et al., "A High Dynamic Range CMOS Variable Gain Amplifier for Mobile DTV Tuner," IEEE Journal of Solid-State Circuits, vol. 42, No. 2, Feb. 2007, pp. 292-301, XP011161685, ISSN: 0018-9200, DOI: 10.1109/JSSC.2006.889386.

* cited by examiner

LOW-NOISE AMPLIFIER (LNA) WITH CAPACITIVE ATTENUATOR

TECHNICAL FIELD

Certain aspects of the present disclosure generally relate to electronic circuits and, more particularly, to an amplifier.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. MSs and BSs may include one or more amplifiers to amplify received signals. These amplifiers may be implemented using a low-noise amplifier (LNA).

SUMMARY

Certain aspects of the present disclosure generally relate to a multi-output amplifier. The multi-output amplifier generally includes a first capacitive attenuator coupled to an input node of the multi-output amplifier, a first amplification stage having an input coupled to a tap node of the first capacitive attenuator and an output coupled to a first output node of the multi-output amplifier, and a second amplification stage having an output coupled to a second output node of the multi-output amplifier.

Certain aspects of the present disclosure provide a method for signal amplification. The method generally includes attenuating an input signal via a first capacitive attenuator, generating a first amplified output signal based on the attenuated input signal via a first amplification stage of a multi-output amplifier, and generating a second amplified output signal based on the input signal via a second amplification stage of the multi-output amplifier.

Certain aspects of the present disclosure provide an apparatus for signal amplification. The apparatus generally includes means for capacitively attenuating an input signal, means for generating a first amplified output signal based on the attenuated input signal, and means for generating a second amplified output signal based on the input signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
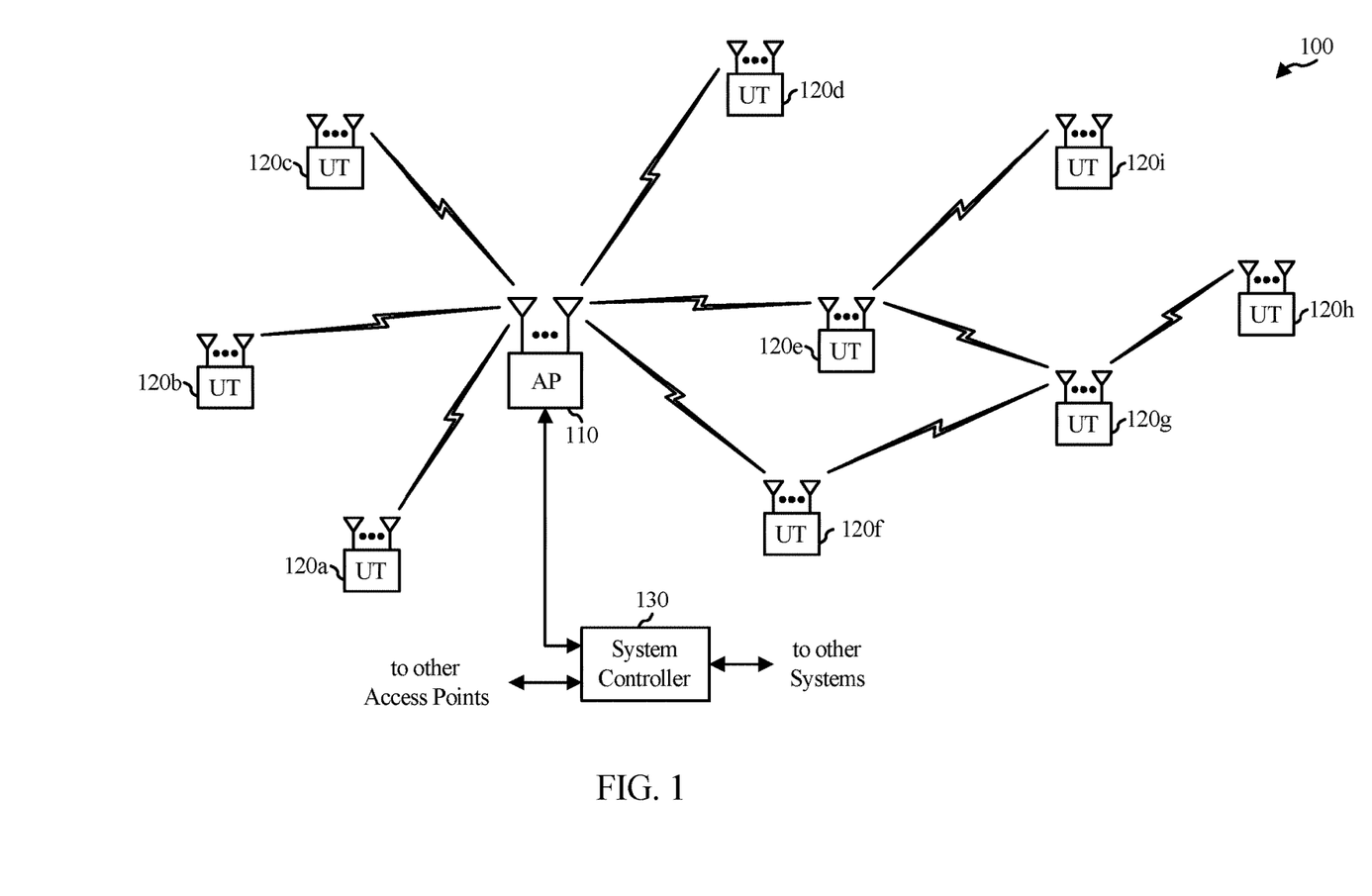
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include an amplifier for amplifying received signals. The amplifier may be implemented using a capacitive attenuator, as described in more detail herein.

Figure 2:
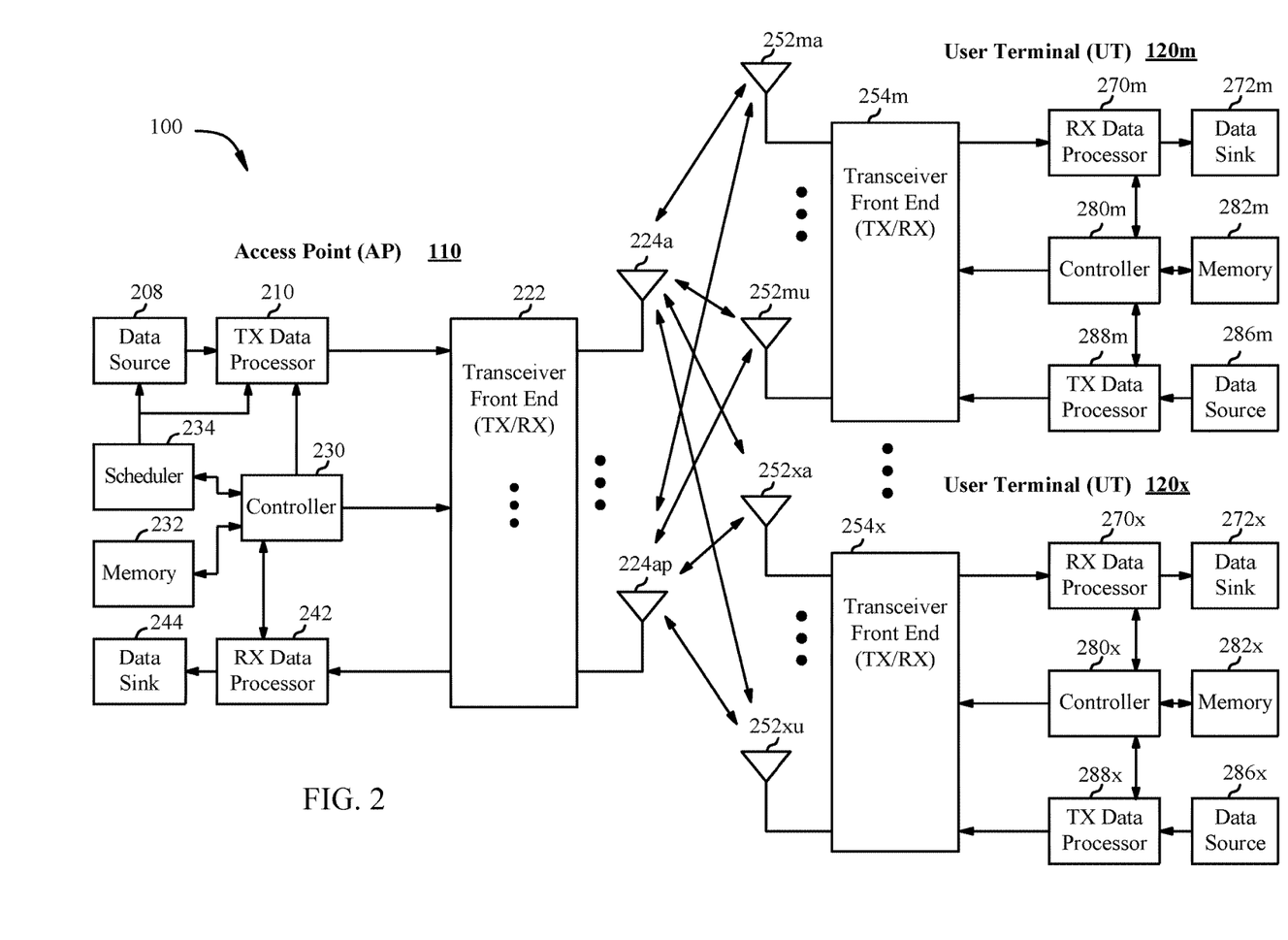
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254

(also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include an amplifier for amplifying received signals. The amplifier may be implemented using a capacitive attenuator, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
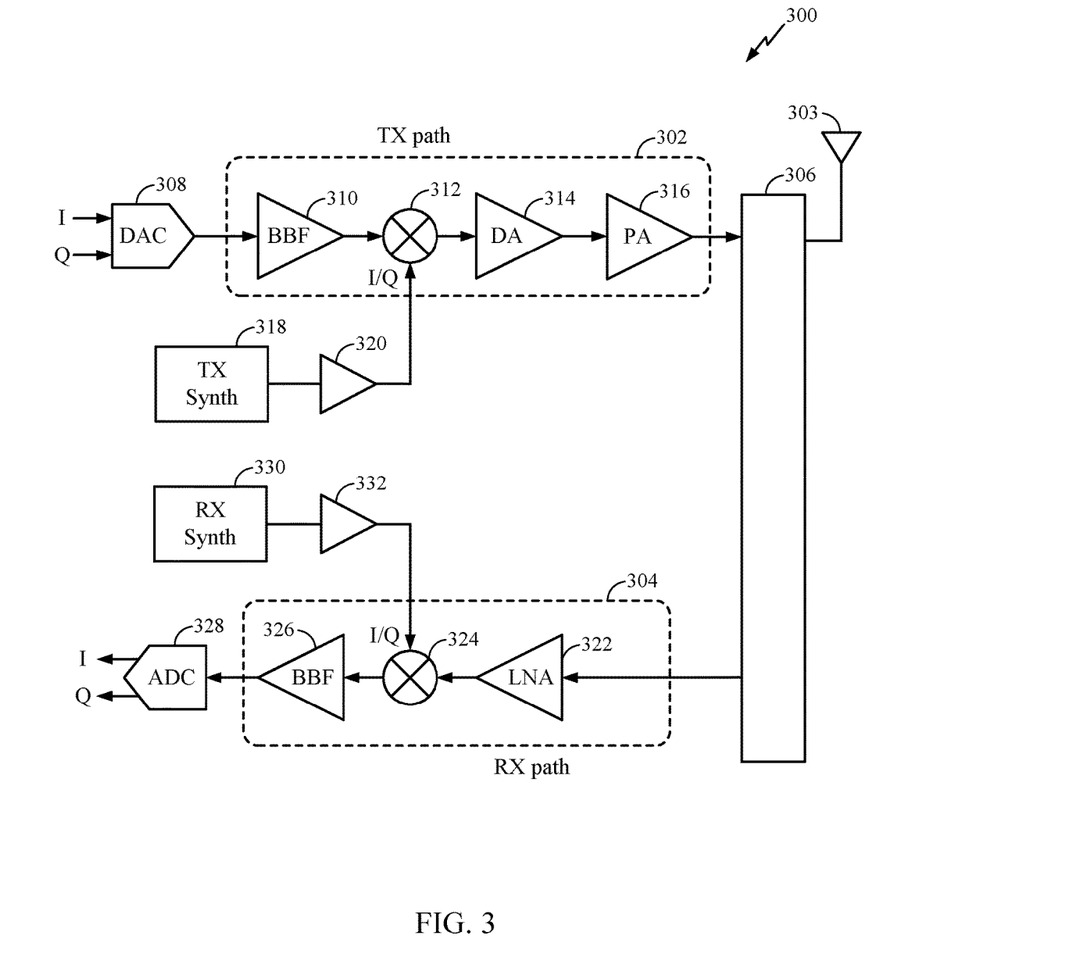
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit LO signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In certain aspects, the LNA may be implemented using a capacitive attenuator, as will be described in more detail herein. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive LO signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Low-Noise Amplifier (LNA)

Certain aspects of the present disclosure are generally directed to a single-input-multiple-output (SIMO) amplifier topology, which in some cases, can provide different gains at different outputs of the amplifier. In certain aspects, the different outputs of the amplifier may be used to provide amplified signals for carrier aggregation (CA). For example, the amplifier may receive an RF signal via an antenna, amplify the RF signal, and provide multiple amplified signals to different CA nodes using separate amplification stages. In some cases, the amplifier may be implemented as a low-noise amplifier (LNA). An LNA generally refers to an amplifier that is designed to amplify low-power signals without significant degradation of the signal-to-noise ratio of the amplified signal.

In some cases, an attenuator may be used to attenuate the RF signal prior to amplification. In some cases, a resistor attenuator may be used to attenuate the RF signal. However, using a resistor attenuator may complicate the design of the amplifier. Moreover, while the resistor attenuator may allow for both the gain and input impedance adjustment for the amplifier, it may not allow for different gains to be set with respect to different outputs of the amplifier.

Certain aspects of the present disclosure provide a multi-output amplifier with a capacitive attenuator and with a separate resistive device for impedance matching to improve design flexibility. In certain aspects, the amplifier may be configured as a single-mode amplifier (also referred to as a "single-gain amplifier") that provides the same gain for the different output nodes when operating in intra-band CA mode. However, in some aspects, the amplifier may be configured as a dual-mode amplifier that can provide different gains for different output nodes simultaneously while operating in intra-band CA mode. For the dual-gain amplifier configuration, certain aspects of the present disclosure may use a single resistive device and two capacitive attenuators to meet noise figure (NF), gain, input matching, and linearity specifications while providing different gains for each output node simultaneously.

Figure 4A:
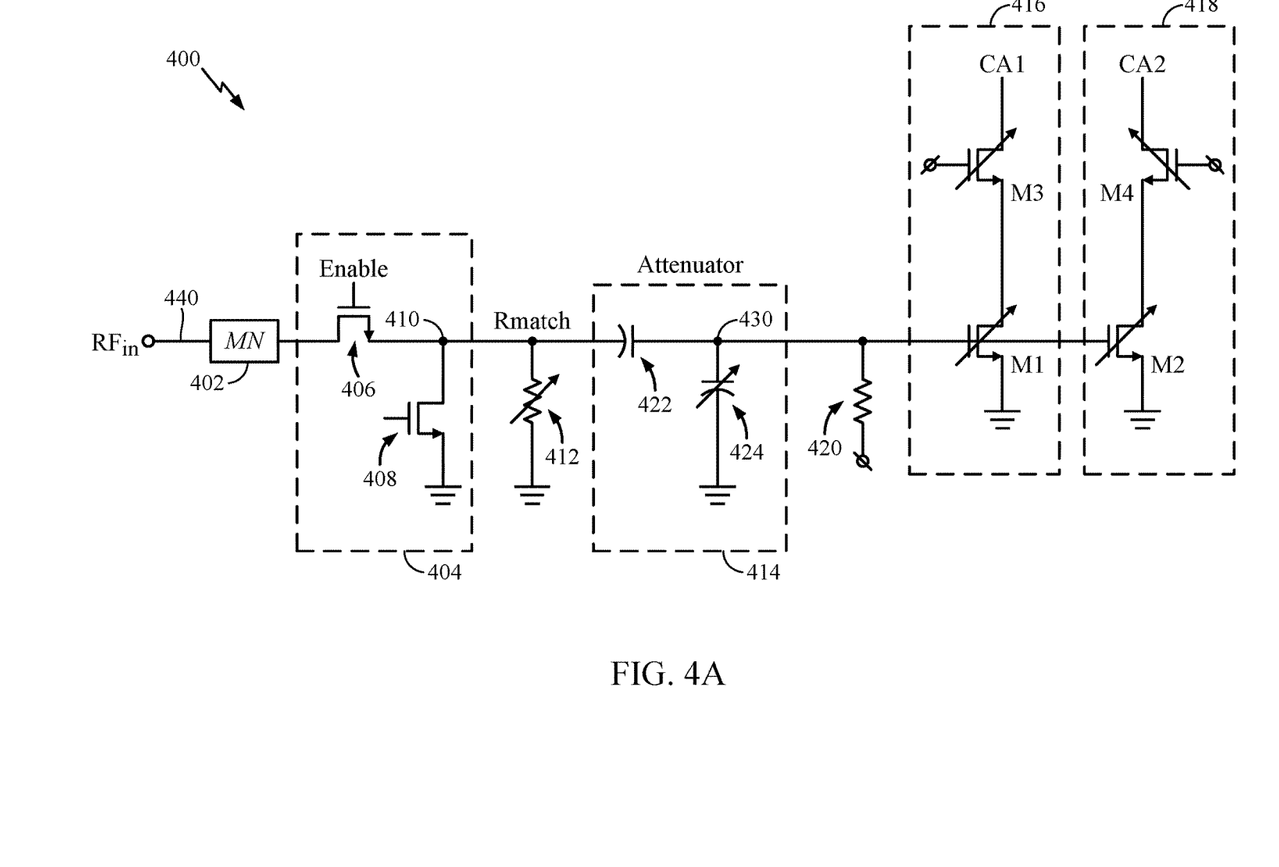
FIG. 4A illustrates an example single-mode amplifier, in accordance with certain aspects of the present disclosure.

FIG. 4A illustrates an example single-mode amplifier 400, in accordance with certain aspects of the present disclosure. As illustrated, the input RF (RFin) node 440 may be coupled to an impedance matching network 402 and a switch network 404 to enable/disable the amplifier 400. For example, the switch network 404 may include a transistor 406 that can be closed (e.g., via an enable signal) to couple the Rfin node 440 to node 410. The switching network 404 may also include a transistor 408 to couple the node 410 to a reference potential (e.g., electric ground) when the transistor 406 is open such that node 410 is not floating.

The node 410 may be coupled to a resistive device (Rmatch) 412 and a capacitive attenuator 414. The capacitive attenuator 414 may be coupled to an amplification stage 416 and an amplification stage 418, each coupled to respective output nodes CA1 and CA2, which may be used for carrier aggregation (CA) (e.g., intra-band CA). The amplification stage 416 may include a transistor M1, and the amplification stage 418 may include a transistor M2, each having a gate coupled to a tap node 430 of the capacitive attenuator 414. Each of transistors M1 and M2 may be coupled to a current-limiting device, implemented with transistors M3 and M4, respectively, in the example amplifier 400 of FIG. 4A. In some cases, the gates of transistors M1 and M2 may be biased through a biasing resistor 420 coupled thereto.

In certain aspects, the resistive device 412 may be implemented using a resistor network (e.g., a resistor string). For example, the resistive device 412 may include multiple resistors in parallel, that can be switched in and out to provide a desired resistance between node 410 and the reference potential. The resistive device 412 provides the real part (i.e., the resistance) of the input impedance (Zin) of the amplifier 400, and can be configured to tune the gain of the LNA. In some cases, the resistive device 412 may be disabled (e.g., open circuited, such as with a switch (not shown) in series) in order to configure the amplifier 400 with high input impedance (HZ).

The capacitive attenuator 414 provides coarse gain control, attenuates the signal at the RFin node 440 for improved linearity, while at the same time, blocking direct-current (DC) signals. For example, DC signals may be blocked by the capacitor 422, and the gain of the amplifier 400 can be controlled by adjusting the capacitor 424. For example, the capacitor 424 may be implemented as a capacitor network (e.g., a capacitor string), which may include multiple capacitors coupled in parallel that can be switched in and out to adjust a total capacitance of the capacitor network, thereby adjusting a gain of the amplifier 400. For other aspects, the capacitor 424 may be implemented with one or more variable capacitors. Additionally or alternatively to capacitor 424 for certain aspects, capacitor 422 may be adjustable and implemented similarly to capacitor 424. With the use of resistive device 412 and the capacitive attenuator 414, the resistive matching and gain control can be decoupled (e.g., can be controlled independently), leading to improved design flexibility.

Figure 4B:
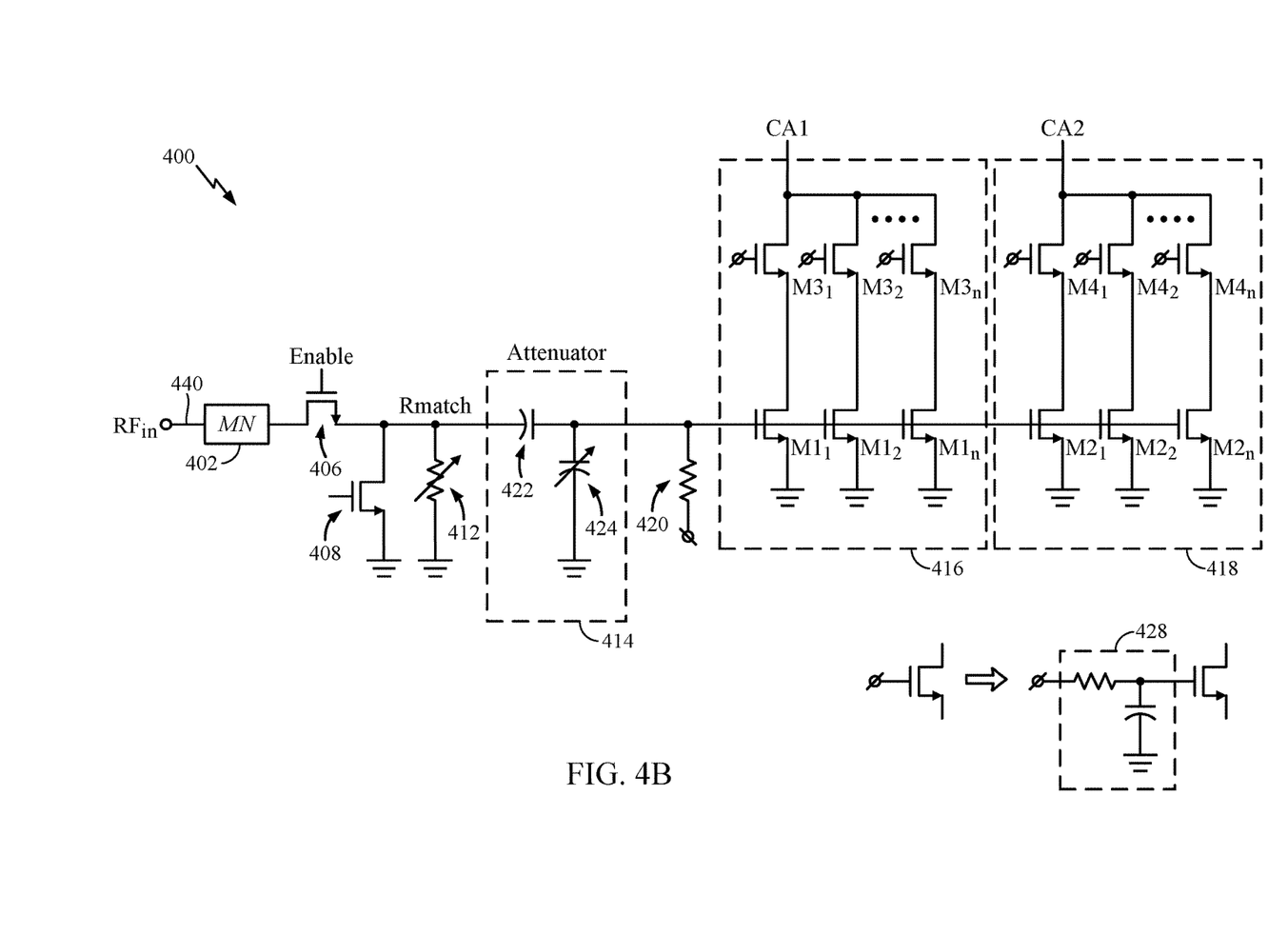
FIG. 4B illustrates an example single-mode amplifier using sliced devices, in accordance with certain aspects of the present disclosure.

FIG. 4B illustrates an example single-mode amplifier 400 using sliced devices, in accordance with certain aspects of the present disclosure. In some cases, further gain control may be provided by using sliced devices in place of transistors M1, M2, M3 and M4, as illustrated. For example, transistors M1, M2, M3 and M4 of FIG. 4A may be implemented using multiple transistors $M1_1$ to $M1_n$, $M2_1$-M2, $M3_1$-$M3_1$, $M4_1$-$M4_n$ that can be biased to adjust the gain of each of the amplification stages 416 and 418. For example, to reduce the gain of the amplification stage 416, the transistor $M3_2$ may be disabled by biasing the gate of transistor $M3_2$ such that the biasing current flow to transistor $M1_2$ is cut off. Thus, the sliced devices may be used to scale the current of each of the amplification stages 416 and 418 while maintaining decent gate-to-source voltage (Vgs) for better linearity in lower gain modes. Moreover, the gates of the transistors M3 and M4 may be biased through a biasing circuit 428, as illustrated.

Figure 5A:
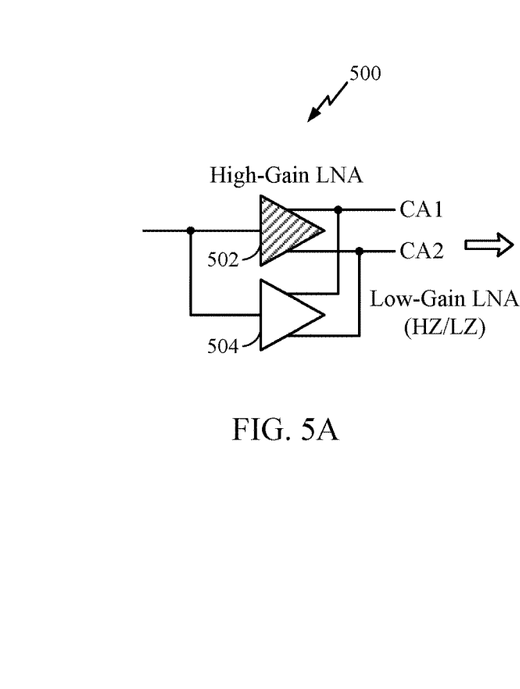
FIG. 5A is a diagram of an example dual-mode amplifier, in accordance with certain aspects of the present disclosure.

FIG. 5A illustrates an example dual-mode amplifier 500, in accordance with certain aspects of the present disclosure. The dual-mode amplifier 500 includes an amplifier 502 and an amplifier 504, each configured to provide multiple amplified output signals to the output nodes CA1 and CA2. In certain aspects, the amplifier 502 may be implemented as a high-gain (HG) amplifier, and the amplifier 504 may be implemented as a low-gain (LG) amplifier in either high input impedance (HZ) mode or low input impedance (LZ) mode. In certain aspects, impedance matching for the amplifier 502 (HG amplifier) may be implemented via inductive degeneration.

Figure 5B:
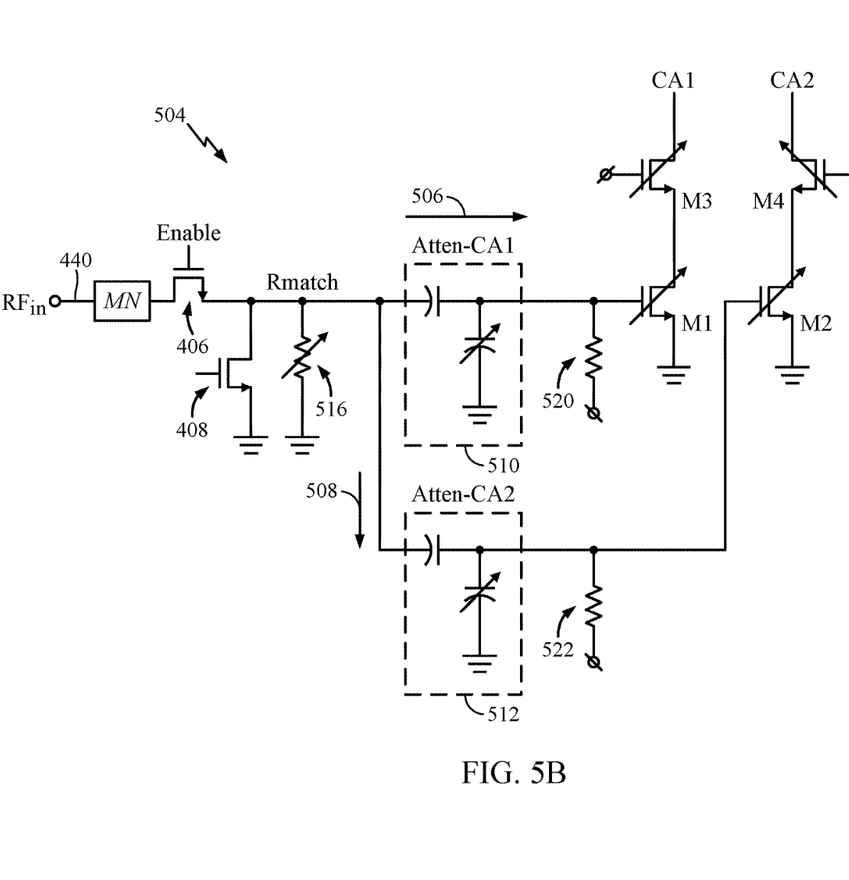
FIG. 5B is a circuit diagram of an example dual-mode amplifier, in accordance with certain aspects of the present disclosure.

FIG. 5B is an example circuit diagram of the amplifier 504, in accordance with certain aspects of the present disclosure. As illustrated, the amplifier 504 includes two amplification paths 506 and 508, each amplification path including a separate capacitive attenuator 510, 512, but sharing a common resistive device 516 for adjusting the input impedance of the amplifier 504. Thus, the matching provided by the resistive device 516 can be performed independently from the gain control (e.g., via the capacitive attenuators 510, 512) of each amplification path, providing increased design flexibility. That is, the resistance of the resistive device can be adjusted to change the input impedance, and the capacitance of the capacitive attenuators 510 and 512 can be varied to adjust the gain of respective amplification paths 506 and 508. In some cases, the resistive device 516 can be disabled (e.g., open circuited) to configure the amplifier 504 in HZ mode, or otherwise may be configured such that amplifier 504 is in LZ mode. As illustrated, each of the transistors M1 and M2 may be biased through respective biasing resistors 520, 522.

Figure 6A:
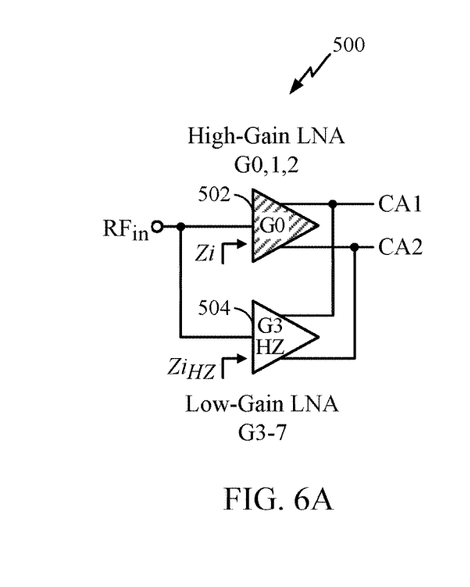
FIG. 6A illustrates an example configuration of a dual mode amplifier, in accordance with certain aspects of the present disclosure.

FIG. 6A illustrates an example configuration of the amplifier 500, in accordance with certain aspects of the present disclosure. As illustrated, the amplifier 502 may be configurable to provide different gains (e.g., G0, G1, and G2) at output nodes CA1 and CA2. The amplifier 504 may be configurable to provide different gains (e.g., G3, G4, G5, G6, and G7) as compared to amplifier 502 at output nodes CA1 and CA2. For example, the amplifier 502 may be configured as a HG amplifier, and the amplifier 504 may be configured as an LG amplifier, as described above with respect to FIG. 5A. That is, gains G0, G1, and G2 that can be provided by amplifier 502 may be higher than gains G3, G4, G5, G6, and G7 that can be provided by amplifier 504. In the example of FIG. 6A, the amplifier 502 may be configured to provide gain G0 for output node CA1, and the amplifier 504 may be configured to provide gain G3 for output node CA2. In certain aspects, the amplifier 504 may be configured to have a high input impedance ($Zi_{HZ}$) that is high enough to avoid disturbing the impedance matching (e.g., via inductive degeneration) provided by amplifier 502. For example, the resistive device 516 of amplifier 504 may be disabled (e.g., open circuited), as will be described in more detail with respect to FIG. 6B.

Figure 6B:
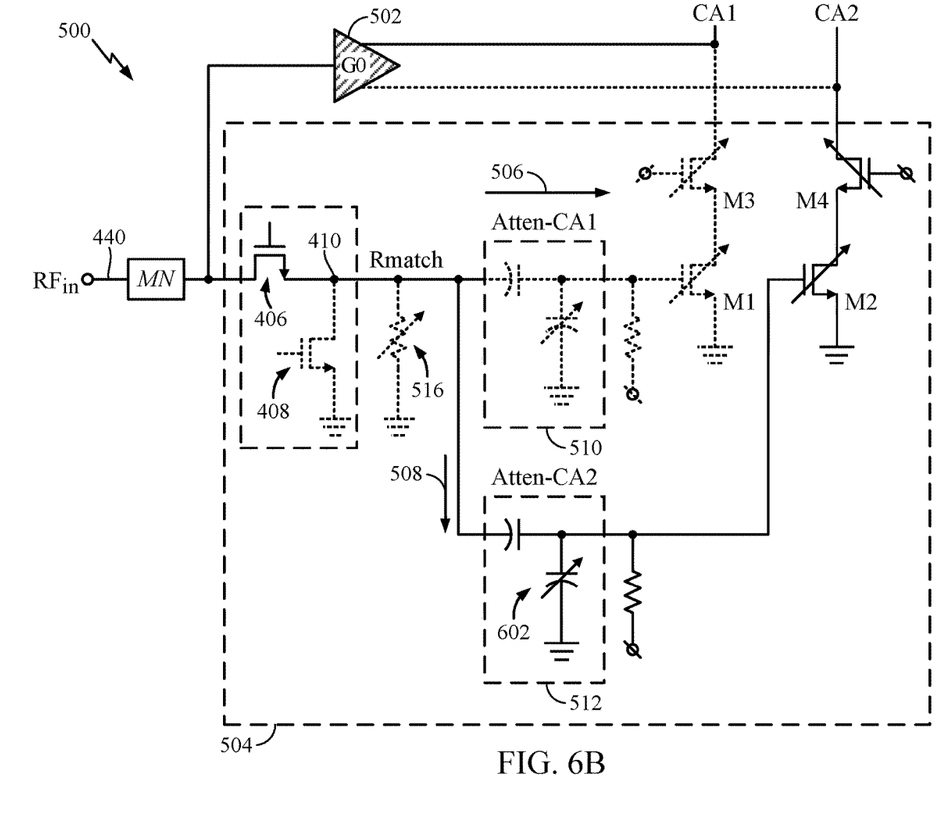
FIG. 6B is a circuit diagram of the example configuration of the dual mode amplifier of FIG. 6A, in accordance with certain aspects of the present disclosure.

FIG. 6B illustrates an example configuration of the amplifier 500, in accordance with certain aspects of the present disclosure. As illustrated, the amplifier 502 is used to apply gain G0 to output node CA1. The amplification path 506 coupled to the output node CA1 is disabled as illustrated by the dotted lines. For example, the amplification path 506 may be disabled by biasing the gate of transistor M3 such that the biasing current flow to the transistor M1 is cut off. Moreover, amplifier 504 is configured in HZ mode by disabling (e.g., open circuiting) the resistive device 516. Thus, the amplifier 504 may be configured to provide gain G3 to output node CA2 via amplification path 508. For example, the capacitance of the capacitor 602 may be adjusted to set the gain of the amplification path 508 to G3 (or any other desired gain setting, such as G4, G5, G6, or G7). Thus, the configuration of the amplifier 500 described with respect to FIG. 6B provides a gain G0 for output node CA1 and a gain of G3 for output node CA2.

As briefly described above, the switch network 404 may be used to selectively couple the Rfin node 440 to node 410. For example, when amplifier 504 is enabled (e.g., either one of amplification paths 506 or 508 are enabled), transistor 406 is on (closed) and transistors 408 is off (open). When amplifier 504 is disabled (e.g., both the amplification paths 506 and 508 are disabled) and the amplifier 502 is enabled, transistor 406 may be off and transistors 408 can be either on or off. Moreover, when both the amplifiers 502 and 504 are disabled, both the transistors 406 and 408 may be turned on (closed) as to prevent having the RFin node 440 floating when the entire amplifier (e.g., both amplifiers 502 and 504) are disabled and not receiving an input RF signal.

Figure 7A:
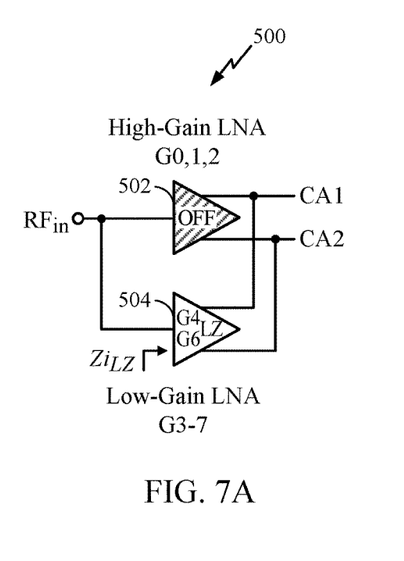
FIG. 7A illustrates another example configuration of a dual mode amplifier, in accordance with certain aspects of the present disclosure.

FIG. 7A illustrates an example configuration of the amplifier 500, in accordance with certain aspects of the present disclosure. In this case, the amplifier 500 is configured to apply gain G4 for output node CA1 and gain G6 for output node CA2. For example, the amplifier 502 (e.g., which may only be configured to provide gains G0, G1, and G3) may be disabled, and the amplifier 504 may apply gains G4 and G6 for respective output nodes CA1 and CA2.

Figure 7B:
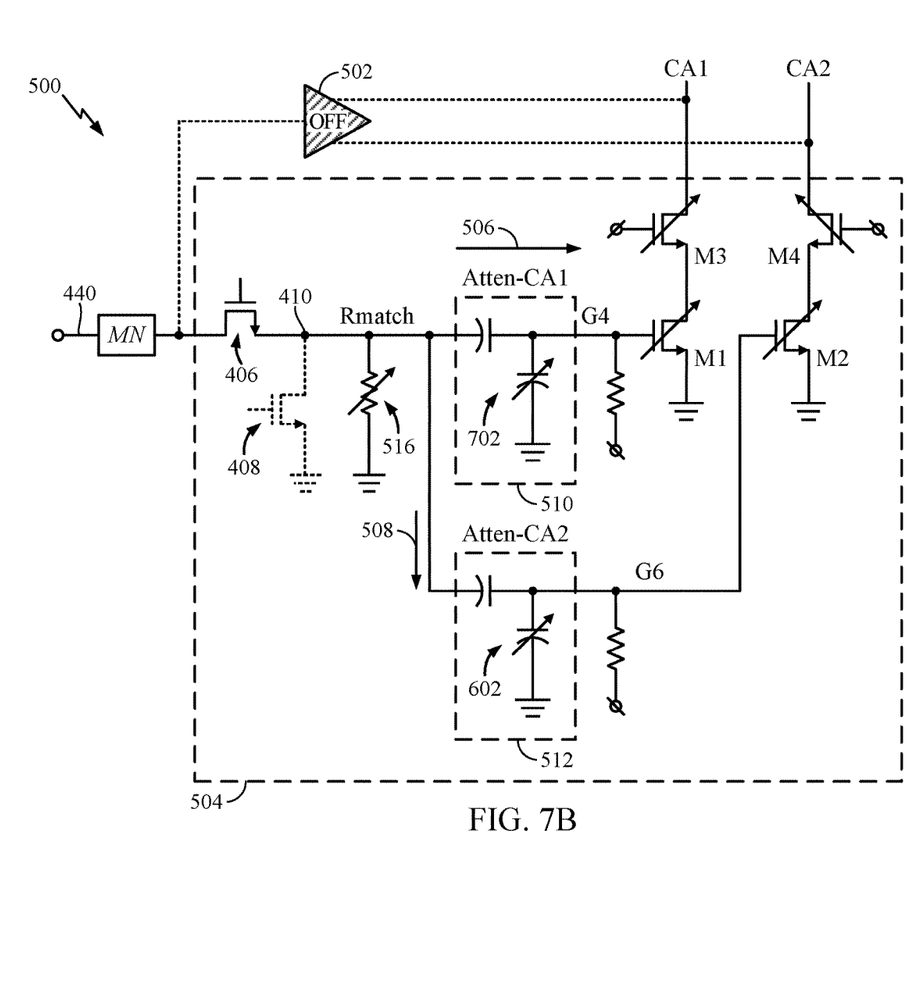
FIG. 7B is a circuit diagram of the example configuration of the dual mode amplifier of FIG. 7A, in accordance with certain aspects of the present disclosure.

FIG. 7B illustrates an example configuration of the amplifier 500, in accordance with certain aspects of the present disclosure. As illustrated, while amplifier 502 is disabled, both the amplification paths 506, 508 are enabled. The capacitance of capacitor 702 may be adjusted to set the gain of amplification path 506 (e.g., set to gain G4 in this example), and the capacitance of capacitor 602 may be adjusted to set the gain of amplification path 506 (e.g., set to gain G6 in this example). Moreover, the amplifier 504 may be configured in LZ mode for impedance matching via the resistive device 516. That is, the resistance of resistive device 516 may be configured to provide the real part of the input impedance of amplifier 504. In certain aspects, sliced devices in place of transistors M1, M2, M3 and/or M4 may be used to tune the gain of respective amplification paths 506 and 508.

Certain aspects of the present disclosure provide a SIMO amplifier structure that uses a single structure amplifier stage to meet different NF/gain specifications at the outputs of the amplifier without compromising input matching. Moreover, aspects of the present disclosure reduce the area consumption of the amplifier as the capacitive attenuator can function to both attenuate and block DC signals (e.g., a separate DC blocking capacitor is not used). In addition, certain aspects of the present disclosure improve design flexibility by enabling independent configuration of impedance matching and gain control. For example, certain aspects of the present disclosure allow for the dynamic control of input impedance and gain for different output nodes.

Figure 8:
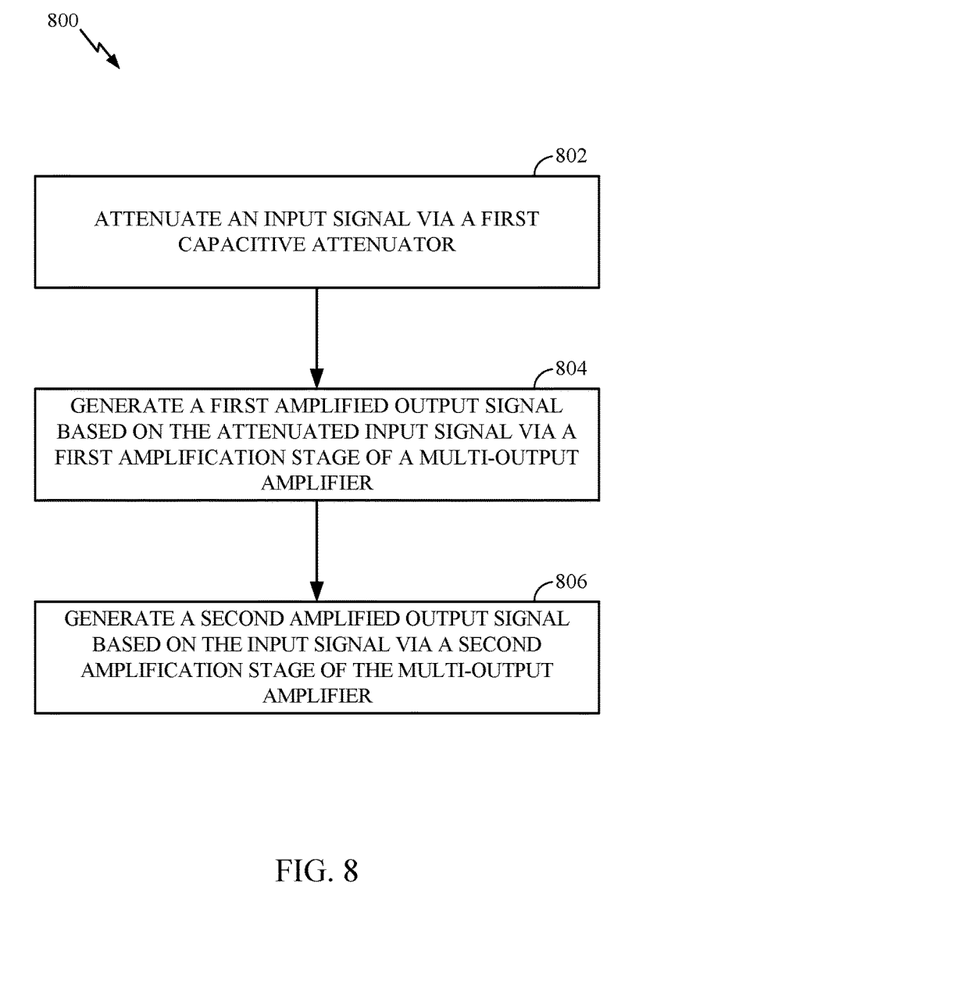
FIG. 8 is a flow diagram of example operations for signal amplification, in accordance with certain aspects of the present disclosure.

FIG. 8 is a flow diagram of example operations 800 for signal amplification, in accordance with certain aspects of the present disclosure. The operations 800 may be performed by a multi-output amplifier, such as the multi-output amplifier of FIG. 4, 5A, 5B, 6A, 6B, 7A, or 7B.

The operations 800 may begin, at block 802, by attenuating an input signal (e.g., at RFin node 440 or node 410) via a first capacitive attenuator (e.g., capacitive attenuator 414 or 510). At block 804, the multi-output amplifier generates a first amplified output signal (e.g., at output node CA1) based on the attenuated input signal via a first amplification stage (e.g., amplification stage 416) of the multi-output amplifier, and at block 806, generates a second amplified output signal based on the input signal via a second amplification stage (e.g., amplification stage 418) of the multi-output amplifier. In certain aspects, the second amplified output signal is generated, at block 806, based on the attenuated input signal via the first capacitive attenuator.

In certain aspects, the operations 800 also include attenuating the input signal via a second capacitive attenuator (e.g., capacitive attenuator 512), wherein generating the second amplified output signal is based on the attenuated input signal from the second capacitive attenuator. In certain aspects, the operations 800 also include setting a gain for the generation of the first amplified output signal by adjusting a capacitance of the capacitive attenuator. In certain aspects, the operations 800 also include setting a gain for the generation of the first amplified output signal and the second amplified output signal by adjusting a resistance of a resistive device (e.g., resistive device 412 or 516) coupled to the input node. In certain aspects, the operations 800 also include setting an input impedance of the multi-output amplifier by adjusting a resistance of a resistive device coupled to the input node.

In certain aspects, the operations 800 also include decoupling a resistive device from an input node of the multi-output amplifier such that the first amplification stage and the second amplification stage have a high input impedance. In certain aspects, the operations 800 also include selectively disabling at least one of the generation of the first amplified output signal or the generation of the second amplified output signal.

A multi-output amplifier as described herein with respect to certain aspects of the present disclosure generally refers to an amplifier with multiple outputs and may be different than a differential amplifier. For example, the output signals generated by the multi-output amplifier may not be inverse of one another as is with a differential output pair of a differential amplifier. Moreover, while examples provided herein have described a multi-output amplifier with two outputs (output node CA1 and output node CA2) to facilitate understanding, the techniques described herein can be applied to a multi-output amplifier with any number of outputs. For example, a multi-output amplifier with N outputs may be implemented with N capacitive attenuators coupled to N amplification stages for each output node. In certain aspects, the N capacitive attenuators may be coupled to a common resistive device used to adjust the input impedance of the multi-output amplifier.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for generating may comprise an amplification stage, such as the amplification stage 416 or 418 of FIG. 4A. Means for capacitively attenuating may comprise a capacitive attenuator, such as the capacitive attenuator 414 of FIG. 4A or the capacitive attenuators 510, 512 in FIG. 5.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A multi-output amplifier comprising:
a first capacitive attenuator coupled to an input node of the multi-output amplifier;
a first amplification stage having an input coupled to a tap node of the first capacitive attenuator and an output coupled to a first output node of the multi-output amplifier, wherein the first amplification stage comprises a first transistor having a drain coupled to a source of a second transistor, the second transistor being coupled to the first output node, and wherein a gate of the first transistor is coupled to the tap node of the first capacitive attenuator; and
a second amplification stage having an output coupled to a second output node of the multi-output amplifier, wherein the second amplification stage comprises a third transistor having a drain coupled to a source of a fourth transistor, the fourth transistor being coupled to the second output node.

2. The multi-output amplifier of claim 1, wherein the second amplification stage has an input coupled to the tap node of the first capacitive attenuator.

3. The multi-output amplifier of claim 1, further comprising:
a second capacitive attenuator coupled to the input node of the multi-output amplifier, wherein the second amplification stage has an input coupled to a tap node of the second capacitive attenuator.

4. The multi-output amplifier of claim 3, wherein:
the third transistor is coupled to the tap node of the second capacitive attenuator.

5. The multi-output amplifier of claim 1, wherein the first capacitive attenuator comprises:
a first capacitor having a first terminal coupled to the input node; and
at least one second capacitor coupled between a second terminal of the first capacitor and a reference potential of the multi-output amplifier.

6. The multi-output amplifier of claim 5, wherein a gain of the first amplification stage is configured to be adjusted based on a capacitance of the at least one second capacitor.

7. The multi-output amplifier of claim 5, wherein a capacitance of at least one of the first capacitor or the second capacitor is variable.

8. The multi-output amplifier of claim 5, wherein a gain of the multi-output amplifier is configured to be adjusted based on a capacitance of the at least one second capacitor.

9. The multi-output amplifier of claim 1, further comprising:
a resistive device coupled between the input node and a reference potential of the multi-output amplifier.

10. The multi-output amplifier of claim 9, wherein a gain of the multi-output amplifier and an input impedance of the multi-output amplifier are adjusted based on a resistance of the resistive device.

11. The multi-output amplifier of claim 1, further comprising:
a second capacitive attenuator coupled to the input node, wherein a gate of the third transistor is coupled to a tap node of the second capacitive attenuator.

12. The multi-output amplifier of claim 11, wherein the gates of the first transistor and the third transistor are shorted together.

13. The multi-output amplifier of claim 1, further comprising:
a high-gain amplifier having an input coupled to the input node of the multi-output amplifier and a first output coupled to the first output node and a second output coupled to the second output node, wherein the high-gain amplifier has a higher gain than the first amplification stage and the second amplification stage.

14. The multi-output amplifier of claim 13, further comprising:
a resistive device selectively coupled between the input node and a reference potential of the multi-output amplifier, wherein the multi-output amplifier is capable of disabling the resistive device such that the first amplification stage and the second amplification stage have a high input impedance.

15. The multi-output amplifier of claim 14, wherein the multi-output amplifier is capable of disabling the high-gain amplifier.

16. The multi-output amplifier of claim 15, wherein the resistive device is configured to be disabled when the high-gain amplifier is enabled.

17. A multi-output amplifier comprising:
a first capacitive attenuator coupled to an input node of the multi-output amplifier;
a first amplification stage having an input coupled to a tap node of the first capacitive attenuator and an output coupled to a first output node of the multi-output amplifier;
a second amplification stage having an output coupled to a second output node of the multi-output amplifier; and
a switch network, wherein the first capacitive attenuator is coupled to the input node through the switch network.

18. The multi-output amplifier of claim 17, wherein the switch network is configured to selectively disable the first amplification stage and the second amplification stage.

19. A method for signal amplification, comprising:
attenuating an input signal via a first capacitive attenuator;
generating a first amplified output signal based on the attenuated input signal via a first amplification stage of a multi-output amplifier, wherein the first amplification stage comprises a first transistor having a drain coupled to a source of a second transistor, the second transistor being coupled to a node for providing the first amplified output signal, and wherein a gate of the first transistor is coupled to a tap node of the first capacitive attenuator; and generating a second amplified output signal based on the input signal via a second amplification stage of the multi-output amplifier, wherein the second amplification stage comprises a third transistor having a drain coupled to a source of a fourth transistor, the fourth transistor being coupled to a node for providing the second amplified output signal.

20. The method of claim 19, wherein the second amplified output signal is generated based on the attenuated input signal.

21. The method of claim 19, further comprising:
attenuating the input signal via a second capacitive attenuator, wherein generating the second amplified output signal is based on the attenuated input signal from the second capacitive attenuator.

22. The method of claim 19, further comprising:
setting a gain for the generation of the first amplified output signal by adjusting a capacitance of the first capacitive attenuator.

23. The method of claim 19, further comprising:
setting a gain for the generation of the first amplified output signal and the second amplified output signal by adjusting a resistance of a resistive device coupled to an input node of the multi-output amplifier.

24. The method of claim 19, further comprising:
setting an input impedance of the multi-output amplifier by adjusting a resistance of a resistive device coupled to an input node of the multi-output amplifier.

25. The method of claim 19, further comprising:
decoupling a resistive device from an input node of the multi-output amplifier such that the first amplification stage and the second amplification stage have a high input impedance.

26. The method of claim 19, further comprising:
selectively disabling at least one of the generation of the first amplified output signal or the generation of the second amplified output signal.

27. An apparatus for signal amplification, comprising:
first means for capacitively attenuating an input signal;
means for generating a first amplified output signal based on the attenuated input signal, wherein the means for generating the first amplified output signal comprises a first means for amplifying connected in cascode with a first means for current-limiting, the first means for current limiting being coupled to a node for providing the first amplified output signal, and wherein a control input of the first means for amplifying is coupled to a tap node of the first means for capacitively attenuating; and
means for generating a second amplified output signal based on the input signal, wherein the means for generating the second amplified output signal comprises a second means for amplifying connected in cascode with a second means for current-limiting, the second means for current-limiting being coupled to a node for providing the second amplified output signal.

28. The apparatus of claim 27, wherein the means for generating the second amplified output signal is configured to generate the second amplified output signal based on the attenuated input signal.

29. The apparatus of claim 27, further comprising:
second means for capacitively attenuating the input signal, wherein the means for generating the second amplified output signal is configured to generate the second amplified output signal based on the attenuated input signal from the second means for capacitively attenuating.

* * * * *